(12) United States Patent
Elsayed (10) Patent No.: US 11,363,228 B1
(45) Date of Patent: Jun. 14, 2022

(54) CURRENT STEERING ARCHITECTURE WITH HIGH SUPPLY NOISE REJECTION

(71) Applicant: SHENZHEN GOODIX TECHNOLOGY CO., LTD., Shenzhen OT (CN)

(72) Inventor: Mohamed Elsayed, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/209,227

(22) Filed: Mar. 23, 2021

(51) Int. Cl.
| | |
|---|---|
| *H04N 5/378* | (2011.01) |
| *H04N 5/357* | (2011.01) |
| *H04N 5/374* | (2011.01) |
| *H04N 5/363* | (2011.01) |
| *H01L 27/146* | (2006.01) |
| *H03M 1/54* | (2006.01) |
| *H03M 1/56* | (2006.01) |
| *H04N 5/3745* | (2011.01) |

(52) U.S. Cl.
CPC .......... *H04N 5/378* (2013.01); *H04N 5/357* (2013.01); *H04N 5/37455* (2013.01); *H01L 27/14643* (2013.01)

(58) Field of Classification Search
CPC .... H04N 5/378; H04N 5/357; H04N 5/37455; H04N 5/363; H01L 27/14643; H01L 27/14612; H03M 1/54; H03N 1/56
See application file for complete search history.

(56) References Cited

U.S. PATENT DOCUMENTS

| | | | |
|---|---|---|---|
| 11,303,293 B1* | 4/2022 | Elsayed | H03M 1/56 |
| 2010/0208112 A1* | 8/2010 | Lim | H04N 5/335 |
| | | | 348/294 |
| 2018/0167573 A1* | 6/2018 | Zhu | H04N 5/378 |
| 2021/0329182 A1* | 10/2021 | Powell | H04N 5/363 |

* cited by examiner

*Primary Examiner* — Marly S Camargo
(74) *Attorney, Agent, or Firm* — Kilpatrick Townsend & Stockton LLP (57) ABSTRACT

Techniques are described for implementing ramp voltage generators with current steering architectures that provide high power supply noise rejection. For example, a current steering architecture uses a sample and hold block and a driver block to control and drive a current steering network. Both generate signals that track supply voltage variations, and those signals are used to generate a ramp voltage. For image sensor applications, image tolerance to ramp noise can be very low when the ramp voltage is low, but can increase appreciably as the ramp voltage increases. As such, embodiments can be implemented to provide high PSR at low ramp voltages, even if the PSR degrades at higher ramp voltages, while maintaining high linearity over the entire ramp voltage.

17 Claims, 4 Drawing Sheets

CURRENT STEERING ARCHITECTURE WITH HIGH SUPPLY NOISE REJECTION

FIELD

The invention relates generally to image sensors. More particularly, embodiments relate to current steering architectures that provide high supply noise rejection for use with ramp generator circuits for pixel conversion in complementary metal-oxide semiconductor (CMOS) image sensors.

BACKGROUND

Many electronic devices include cameras and other features that rely on digital image sensors. For example, most modern smartphones include one or more digital cameras that rely on digital image sensing hardware and software to capture and process images. Such applications often perform image sensing using a complementary metal-oxide semiconductor (CMOS) image sensor (CIS). Over time, consumers have desired increased performance from these image sensors, including higher resolution and lower noise. Further, particularly in portable electronic devices (e.g., with fixed battery capacity), it has been desirable to provide such features without adversely impacting power consumption and dynamic range. For example, analog power drives a significant, if not dominant, part of the power consumption of a modern CIS. As such, implementing a high-performance CIS in a portable electronic device can involve designing analog-to-digital converters (ADCs) and other components within strict power efficiency and noise constraints.

The ADCs in the CMOS image sensors convert analog pixel information into digital code. Conventional architectures typically include a ramp-based ADC that compares an analog pixel output voltage (corresponding to signal intensity detected by the pixel) against a reference ramp voltage. Typically, a same ramp voltage is shared across an entire row of pixels. As modern image sensors can typically include thousands of pixels in each row, there can typically be thousands of comparators being used in the row for analog-to-digital conversion, all based on the same ramp voltage. The comparator and the ramp generator can be significant sources of noise in each row of pixels, and image quality can depend appreciably on keeping that noise well below other pixel noise (e.g., random pixel noise).

BRIEF SUMMARY OF THE INVENTION

Embodiments include ramp voltage generators with current steering architectures that provide high power supply noise rejection. For example, a current steering architecture uses a sample and hold block and a driver block to control and drive a current steering network. Both generate signals that track supply voltage variations, and those signals are used to generate a ramp voltage. For image sensor applications, image tolerance to ramp noise can be very low when the ramp voltage is low, but can increase appreciably as the ramp voltage increases. As such, embodiments can be implemented to provide high PSR at low ramp voltages, even if the PSR degrades at higher ramp voltages, while maintaining high linearity over the entire ramp voltage.

According to one set of embodiments, a ramp voltage generator is provided. The ramp voltage generator includes: a sample and hold block to generate a set of current reference signals by, in a sample mode, sampling the set of current reference signals from a set of reference voltages, and, in a hold mode, holding the set of current reference signals from the sampling as a set of supply-tracked reference voltages tracked to a supply voltage rail; a current generator block to generate a ramp current based on the supply voltage rail and the set of current reference signals; a driver to generate a set of steering control signals to selectively indicate one of a ramp-run mode and a ramp-stop mode responsive to a ramp start/stop signal, such that the set of steering control signals are supply-tracked to the supply voltage rail at least when indicating the ramp-run mode; and a current steering block, coupled with the current generator block and the driver, to steer the ramp current to a load path to generate a ramp voltage responsive to the set of steering control signals indicating the ramp-run mode, and to steer the reference current to a ramp-stop path (e.g., a ground path) responsive to the set of steering control signals indicating the ramp-stop mode, such that, in the ramp-run mode, the ramp current is supply-tracked to the supply voltage rail based on the set of steering control signals and the set of current reference signals. Some such embodiments are implemented as part of an analog-to-digital converter that includes the ramp voltage generator and also includes a plurality of pixel conversion comparators, each coupled with the load path of the current steering block to generate a respective pixel output based on comparing the ramp voltage against a respective one of a plurality of pixel response input voltages.

According to another set of embodiments, a method is provided for generating a ramp voltage. The method includes, responsive to a ramp start/stop signal indicating a ramp-stop mode in a first timeframe: configuring a sample and hold block to generate a set of current reference signals using a set of non-supply-tracked reference voltages that are not tracked to a supply voltage rail, thereby directing a current generator block to generate a ramp current based on the set of non-supply-tracked reference voltages; and configuring a driver to generate a set of steering control signals to indicate the ramp-stop mode, thereby directing a current steering block to steer the ramp current to a ramp-stop path. The method further includes, responsive to the ramp start/stop signal indicating a ramp-run mode in a second timeframe: configuring the sample and hold block to generate the set of current reference signals by holding the set of current reference signals from the sampling as a set of supply-tracked reference voltages tracked to the supply voltage rail, thereby directing the current generator block to generate the ramp current based on the set of supply-tracked reference voltages; and configuring the driver to generate the set of steering control signals to indicate the ramp-run mode, thereby directing the current steering block to generate the ramp voltage by steering the ramp current to a load path, such that, in the ramp-run mode, the ramp current is supply-tracked to the supply voltage rail based on the set of steering control signals and the set of current reference signals.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
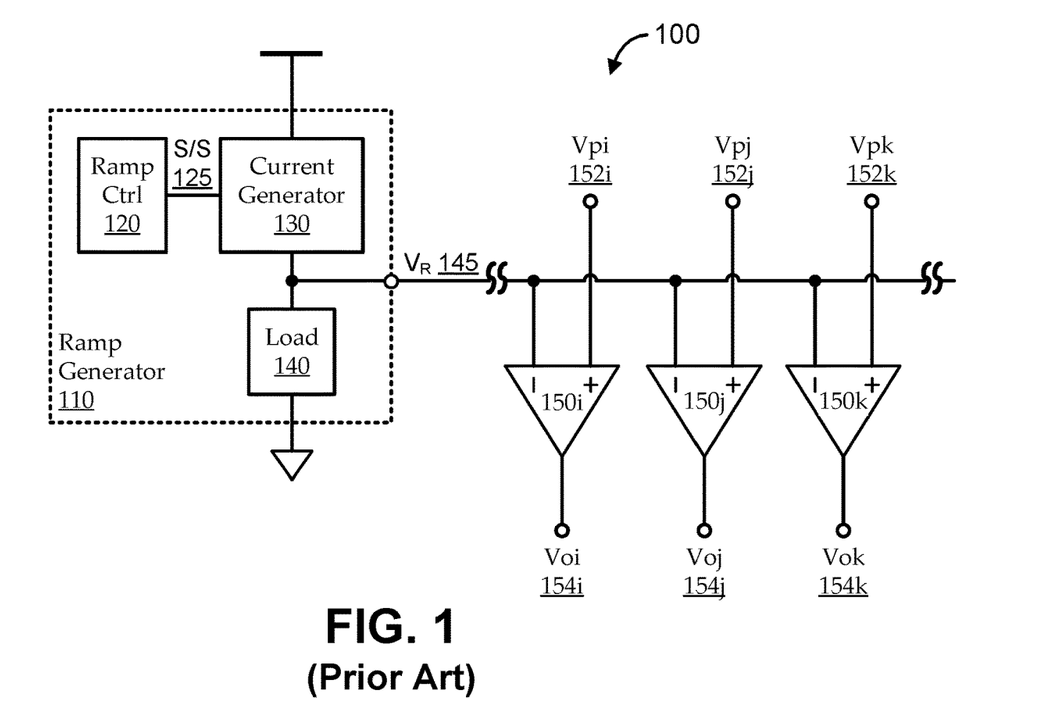
FIG. 1 shows an illustrative conventional pixel analog-to-digital converter.

FIG. 1 shows an illustrative conventional pixel analog-to-digital converter (ADC) 100. As illustrated, the conventional ADC 100 includes a conventional pixel ramp voltage generator 110 coupled with a number of comparators 150. The conventional pixel ramp voltage generator 110 generates a ramp voltage, which can essentially be a voltage that begins at a low starting level and charges to a high ending level in a substantially linear fashion. A simplified block diagram of the conventional pixel ramp voltage generator 110 is illustrated as including a ramp controller 120, a current generator 130, and a load 140. To generate a ramp voltage output ($V_R$) 145, the ramp controller 120 can assert a ramp start signal 125. For example, a start/stop (S/S) signal is used, where ramp start corresponds to one state of the signal (e.g., HIGH), and ramp stop corresponds to the complementary state of the signal (e.g., LOW).

In response to the ramp start signal 125, the current generator 130 begins flowing a charging current through the load 140, which charges the load 140. As one example, the current generator 130 includes transistors, or the like, to inject a substantially constant charging current into a capacitive load 140. Injecting the charging current into the load 140 can cause the voltage across the capacitive load 140 (corresponding to $V_R$ 145) to increase substantially linearly with time. As another example, the current generator 130 includes a programmable current source (e.g., a current digital-to-analog converter controlled by an input code) to inject a changing charging current into a resistive load 140. The input code, or other control of the programmable current source is adjusted over the ramp cycle, such that the changing charging current injected into the load 140 cause the voltage across the resistive load 140 (corresponding to $V_R$ 145) to increase substantially linearly with time.

The output of the conventional pixel ramp voltage generator 110, a same $V_R$ 145, is coupled with a first input (e.g., the negative input) of each of the comparators 150. For example, in this way, the same ramp voltage is shared across all comparators 150 of a row of pixels of an image sensor. The other input (e.g., the positive input) of each of the comparators 150 is coupled with a respective pixel response voltage 152 for a corresponding pixel. For example, the pixel response voltage 152 is an analog output of the pixel corresponding to the intensity of light (e.g., number of photons) detected by the pixel. For the sake of illustration, three comparators 150 are shown, corresponding to three adjacent pixels in a row. The comparators 150 are indicated sequentially as 150i, 150j, and 150k; and the respective pixel response voltages 152 are indicated sequentially as 152i, 152j, and 152k. Each comparator 150 compares its respective pixel response voltage 152 to $V_R$ 145. $V_R$ 145 can be configured so that the ramp begins at a level assumed to be below any pixel response voltage 152, and so that the ramp ends at a level assumed to be above any pixel response voltage 152.

At some point in a pixel conversion cycle, the linearly changing level of $V_R$ 145 will cross the level of the pixel response voltage 152, thereby triggering a change in state of the output of the corresponding comparator 150. As different levels of pixel response voltage ($V_P$) 152 will result in different timing for the state change at the output of the comparator 150, the timing can be used as a measure of the pixel output voltage ($V_O$) 154 for that pixel. For example, a digital counter can be used to count an elapsed time from the beginning of the ramp until the transition in state of the pixel output voltage 154, and the final count can be a digital representation of the analog value of the pixel response voltage 152.

Figure 2:
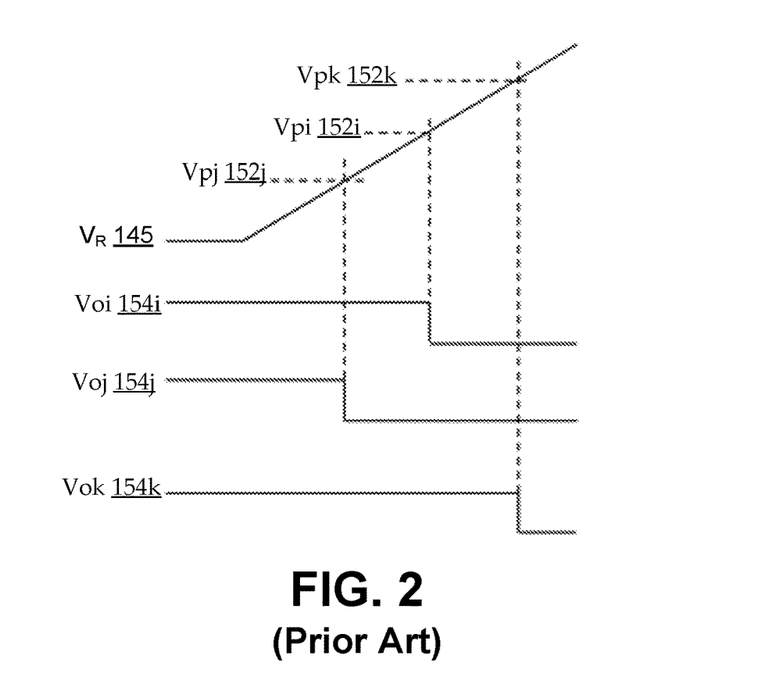
FIG. 2 shows simplified plots of illustrative inputs and outputs of the three comparators of FIG. 1.

For added clarity, FIG. 2 shows simplified plots of illustrative inputs and outputs of the three comparators 150 of FIG. 1. As illustrated, $V_R$ 145 begins at some low level and rises substantially linearly over time. As $V_R$ 145 increases, it crosses the level of $V_P$j 152j, of $V_P$i 152i, and finally of $V_P$k 152k. For example, a photodetector at the pixel corresponding to $V_P$k 152k has the highest detected intensity, followed by the one corresponding to $V_P$i 152i, and finally to the one corresponding to $V_P$j 152j. Each time the rising level of $V_R$ 145 crosses one of the pixel response voltage 152 levels, the state of the corresponding pixel output voltage 154 (i.e., the output of the corresponding comparator 150) changes from HIGH to LOW. It can be seen, for example, that $V_O$j 154j is HIGH for the shortest time, corresponding to $V_P$j 152j having the lowest detected pixel level.

The process of beginning the ramp, detecting respective timing of ramp level crossings for all the pixels in a row, and ending the ramp can be considered as a pixel row conversion cycle. Many image sensor designs use a two-phase conversion cycle, whereby two conversion phases are used in each cycle for each pixel in each row to generate an ADC result. For example, in a first phase, a reset voltage on each pixel line is converted. The reset voltage does not include image information, but it tends to include various noise artifacts, such as low-frequency noise from the pixel ramp voltage generator 110 and the comparators 150. In a second phase, the reset voltage plus the image information are converted. By subtracting the two outputs, the reset voltage is cancelled out, while image information is retained. Because some of the noise is common in both phases, the subtraction tends to reduce the noise influences of the pixel ramp voltage generator 110 and the comparators 150 (e.g., much of the low-frequency noise), as long as that noise does not appreciably change between the two conversion phases.

Even with such subtraction, pixel ramp voltage generator 110 and the comparators 150 tend to contribute noise to the pixel outputs (e.g., as artifacts on pixel output voltages 154).

For example, it can be seen in FIG. 1 that the same ramp voltage ($V_R$ 145) is shared many pixels, such as across an entire row of pixels. As modern image sensors can typically include thousands of pixels in each row, there can typically be thousands of comparators 150 being used in the row for analog-to-digital conversion based on the same $V_R$ 145. Many typical image sensor applications are designed to operate within very strict noise specifications at least because the human eye can detect noise patterns even well below random pixel noise levels. For example, human eyes will tend to notice image distortion even where half of a pixel row has added voltage noise that is 10× below (i.e., ten times less that) the random noise level of the individual pixels in the row. One such specification, referred to as "row-temporal noise," relates to variations in the average noise of a pixel row. For example, comparator outputs (e.g., pixel output voltages 154) can be averaged across a row in different frames, and variations of this average across multiple frames can represent the row-temporal noise. Many conventional consumer image sensor applications specify a maximum row-temporal noise of around 20× below the comparator 150 and pixel noise levels. Because noise from the pixel ramp voltage generator is repeated on all the comparator outputs, the average noise of any row tends to strongly correlate to noise in $V_R$ 145. As such, achieving row-temporal noise specifications and/or other noise specifications can involve implementing a pixel ramp voltage generator with very low noise in $V_R$ 145.

However, implementing pixel ramp voltage generators with sufficiently low ramp noise can be difficult for a number of reasons. One reason is that, with all the ADCs (specifically the comparators 150) in a row coupled to a same $V_R$ 145, any noise from the ramp generator can be correlated noise across the pixels in a row, which can be noticeable to the human eye even at very low levels. Another reason is that triggering of any comparator 150 in a row (i.e., a change in state of the pixel output voltage 154) can manifest a kickback voltage on the shared $V_R$ 145 for that row. In some cases, the disturbance on $V_R$ 145 caused by such a kickback voltage can cause subsequent mis-conversions of other pixels in the row, especially where there are sharp transitions. Thus, even at very low levels, these and other sources of noise in the pixel ramp voltage generators can result in detectable image blurring and/or other image distortions. Some examples of pixel ramp generators designed to address such noise-related concerns are described in U.S. patent application Ser. No. 17/187,806, titled "PIXEL RAMP GENERATOR FOR IMAGE SENSOR", filed on Feb. 28, 2021, the entire disclosure of which is hereby incorporated in its entirety.

Another source of noise during pixel conversion is a result of power supply fluctuations. For example, maintaining a linear voltage ramp can involve carefully maintaining a constant current through the load, which typically relies on designing architectures to manifest both good linearity and good rejection of power supply fluctuations (so-called "power supply rejection," or "PSR"). In conventional approaches, linearity and PSR can tend to be competing design constraints, such that convention architectures tend to reflect a compromise between linearity and PSR. Embodiments described herein include various circuits and processes to generate a voltage ramp with both high linearity and high PSR. For example, a novel current steering architecture uses a sample and hold block and a driver block to control and drive a current steering network. Both the sample and hold block and the driver block are designed for high PSR. In particular, embodiments described herein recognize that, for image sensor applications, image tolerance to ramp noise is low when the ramp voltage is low, but the image tolerance to ramp noise increases as the ramp voltage increases. As such, embodiments are directed to have high PSR at low ramp voltages, even if the PSR degrades at higher ramp voltages, while still maintaining high linearity over the voltage ramp. Some proposed implementations herein have been shown experimentally to improve PSR by approximately 20 dB.

Figure 3:
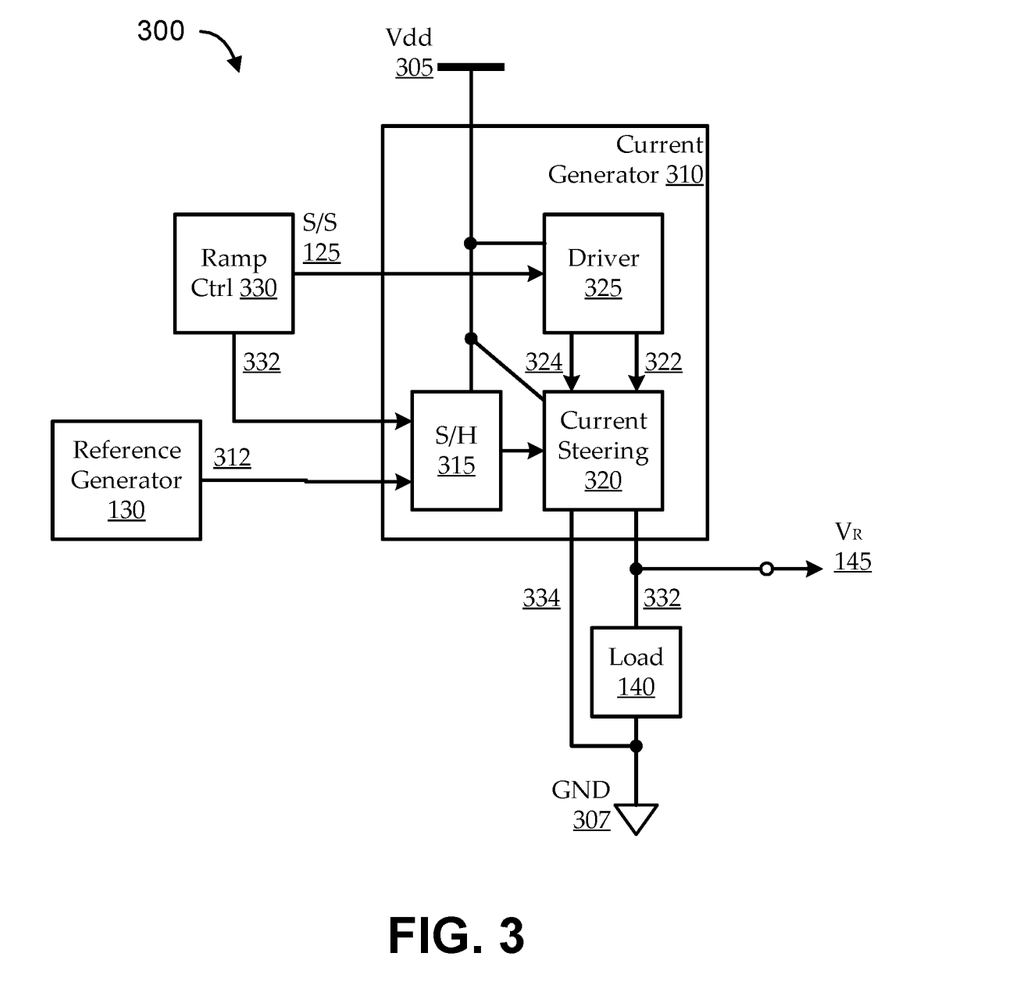
FIG. 3 shows a block diagram of a novel ramp voltage generator 300, according to embodiments described herein.

FIG. 3 shows a block diagram of a novel ramp voltage generator 300, according to embodiments described herein. As illustrated, the ramp voltage generator 300 can include a reference generator 130, a ramp controller 330, a current generator 310, and a load 140. The Reference generator 130 can include any suitable components for generating a stable reference 312 (i.e., a stable reference voltage and/or current) for use by the current generator 310 in generating a desired ramp voltage 145. For example, the reference generator 130 includes a bandgap voltage generator. Embodiments of the ramp controller 330 can generate any suitable control signals, including a ramp start/stop signal (S/S) 125, and a sample/hold signal 332. Embodiments can include additional components that are not explicitly shown, such as a reset block to reset components of the ramp voltage generator 300 between pixel conversion cycles and/or phases, a slope calibration engine to provide dynamic feedback control over the slope of the generated ramp voltage 145, etc. Some implementations of the reference generator 130 and the ramp controller 330 (e.g., and the reset block, slope calibration engine, and other components) are described in U.S. Patent Applications already incorporated herein by reference.

Embodiments of the current generator 310 include a sample and hold block 315, a current steering block 320, and a driver 325. Using these components, the current generator 310 can selectively toggle between a ramp-run mode and a ramp-stop mode based on the ramp start/stop signal 125 from the ramp controller 330. The current generator 310 can operate to generate and maintain a stable ramp current, based on the reference 312 provided by the reference generator 130. In the ramp-run mode, embodiments can steer the reference current to a load path 332 (e.g., to inject the current into load 140) to generate the ramp voltage ($V_R$ 145) at a ramp voltage output node. As described with reference to FIG. 1, injecting the stable ramp current into the load 140 causes the load 140 to charge. Some implementations use a capacitive load 140, such that injecting a constant ramp current can cause the voltage across the load 140 to increase linearly. This linearly increasing voltage can be used as the ramp voltage 145 output of the ramp voltage generator 300. In the ramp-stop mode, embodiments can steer the reference current to a ramp-stop path 334.

For example, conventional pixel ramp voltage generators typically run a current source when generating $V_R$ 145, and turn off the current source, or decouple the current source from the load path, to stop generating $V_R$ 145 (i.e., when the ramp is complete). Each time the current source is turned back on, it may have slightly different noise components. As such, turning the current source off and on between phases of a two-phase pixel conversion cycle can result in differences in low-frequency noise between the two phases. If the ADC outputs from the two phases are subtracted, the changing noise will tend to be doubled. In the ramp voltage generator 300, by steering the current between pixel conversion cycles and/or phases (instead of switching it off), the same low-frequency noise can be maintained. As such, when the ADC 300 outputs are subtracted for the two conversion phases, the now-common low-frequency noise from the current source will tend to cancel out.

Embodiments of the ramp voltage generator 300 include a sample and hold block 315 coupled between an output of the reference generator 130 and an input to the current steering block 320. The sample and hold block 315 can be configured to selectively toggle between a sample mode and a hold mode based on a sample/hold signal 332. When operating in the sample mode, the sample and hold block 315 can sample the reference 312 (e.g., a reference voltage) being output by the reference generator 130. When operating in the hold mode, the sample and hold block 315 can hold the reference as sampled by the sample and hold block 315 in the sample mode. For example, the sample and hold block 315 can hold by maintaining a reference voltage, maintaining a reference current, and/or maintaining any other value that corresponds to the reference. Embodiments of the sample and hold block 315 can also decouple the current steering block 320 from the reference generator 130 as needed. For example, when the sample and hold block 315 is in the hold mode, the sample and hold block 315 electrically decouples (e.g., isolates) the current steering block 320 from the reference generator 130, such that the current steering block 320 is referenced based on the reference held by the sample and hold block 315 in the hold mode (i.e., not by the reference being generated by the reference generator 130). In conventional architectures, components of the reference generator 130 can contribute noise to the ramp generation, and the contributed noise may change, even between phases of a multi-phase pixel conversion. Using the sample and hold block 315 to isolate the current steering block 320 from the reference generator 130 can suppress (or even eliminate) noise coming from those reference generator 130 components. Such isolation can provide additional features, such as improving the power supply rejection ratio, as described herein.

In some embodiments, the sample and hold block 315 is used to sample and hold reference signals prior to each ramp generation cycle. In other embodiments, the sample and hold block 315 is used to sample and hold reference signals prior to each pixel conversion cycle, where the pixel conversion cycle includes multiple phases, each including a ramp generation cycle (i.e., the same sampled and held reference signals are used throughout the pixel conversion cycle). In other embodiments, the sample and hold block 315 is used to sample and hold reference signals once per each N ramp generation cycles, where N is an integer greater than 1.

For example, the same sampled and held reference signals are used for every ten ramp generation cycles. In other embodiments, the sample and hold block 315 is used to sample and hold reference signals responsive to a predetermined trigger condition. For example, the sample and hold block 315 can be triggered to obtain and hold a new sample of reference signals after a predetermined amount of time has passed since a last sample was obtained, or the sample and hold block 315 can be triggered to obtain and hold a new sample of reference signals upon a condition that tends to impact the reference generation (e.g., upon startup, upon detection of a power fluctuation, etc.).

Notably, while using the sample and hold block 315 and the current steering block 320 can reduce ramp noise, generation of the ramp voltage 145 can still be sensitive to fluctuations in the power supply level (Vdd) 305. For example, the sample and hold block 315 can hold the reference level relative to Vdd 305; any fluctuations in Vdd 305 can similarly result in fluctuations of the held reference. As illustrated, the current steering block 320 can be driven by the driver 325. For example, rather than controlling the current steering block 320 directly from the out of the ramp controller 330, steering control signals 322, 324 are generated by the driver 325 responsive to the ramp start/stop signal 125. Both the sample and hold block 315 and the driver 325 are coupled with Vdd 305 and are configured to hold respective reference voltage levels in a manner that track fluctuations in Vdd 305 (referred to as "supply-tracked" herein). The current steering block 320 can then be used to generate and maintain a stable ramp current based on the supply-tracked references and/or signals. In this way, the generation of the ramp voltage 145 dynamically responds to fluctuations in Vdd 305, thereby providing high PSR.

Embodiments of the ramp voltage generator 300 (or components thereof) can be implemented in any suitable manner. For example, the ramp voltage generator 300 can include, or can be implemented on, a central processing unit CPU, an application-specific integrated circuit (ASIC), an application-specific instruction-set processor (ASIP), a graphics processing unit (GPU), a physics processing unit (PPU), a digital signal processor (DSP), a field-programmable gate array (FPGA), a programmable logic device (PLD), a controller, a microcontroller unit, a reduced instruction set (RISC) processor, a complex instruction set processor (CISC), a microprocessor, or the like, or any combination thereof. While illustrated as part of the ramp voltage generator 300, the ramp controller 330 can be implemented as a separate component in communication with the ramp voltage generator 300. For example, the ramp voltage generator 300 can be implemented with control input nodes, and those control input nodes can be coupled with signal output nodes of a separate processor implementing the ramp controller 330.

Figure 4:
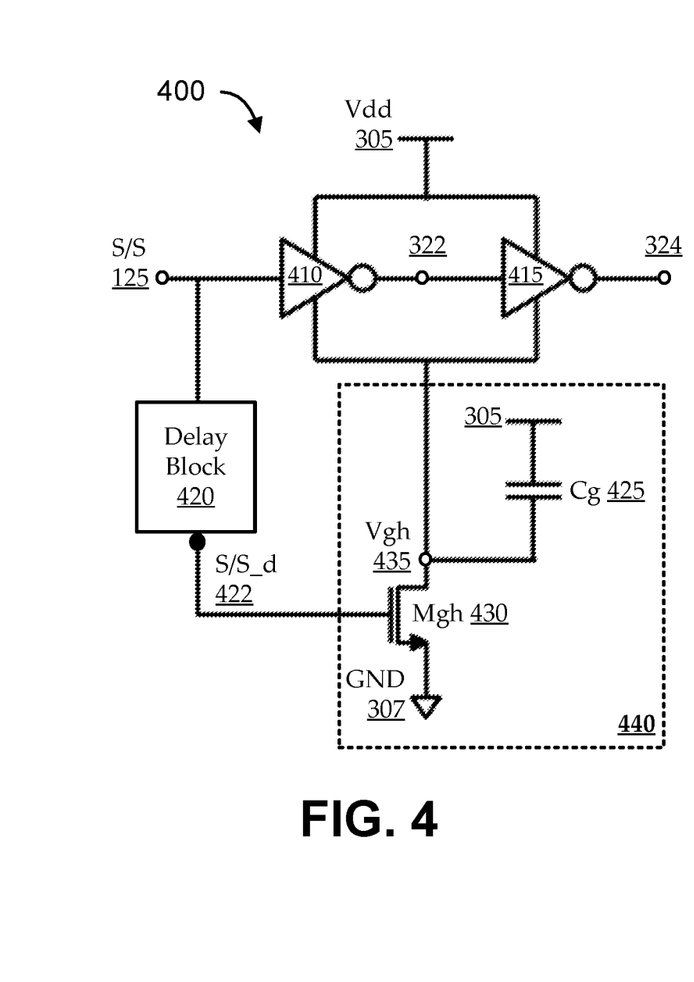
FIG. 4 shows a simplified circuit implementation of a driver 400 for use with a ramp voltage generator, according to embodiments described herein.
Figure 5:
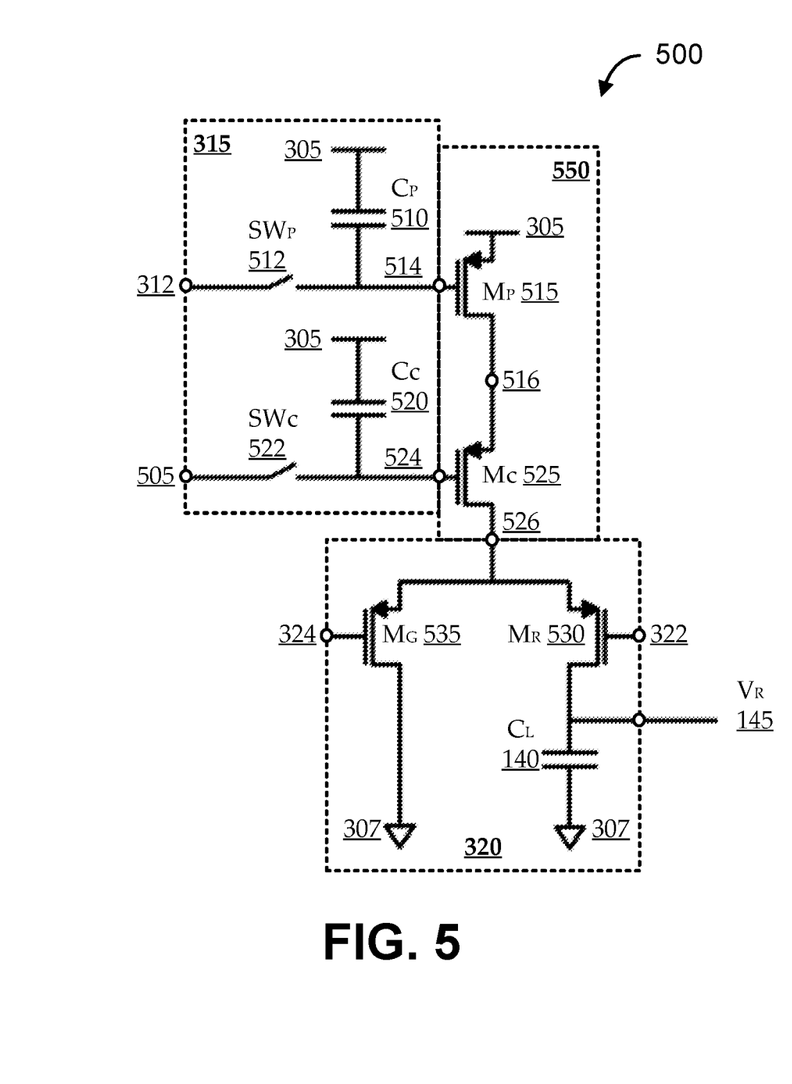
FIG. 5 shows a simplified circuit implementation of a partial current generator 500 sample and hold block and current steering block a for use with a ramp voltage generator, according to embodiments described herein.

FIG. 4 shows a simplified circuit implementation of a driver 400 for use with a ramp voltage generator, according to embodiments described herein. FIG. 5 shows a simplified circuit implementation of a partial current generator 500 sample and hold block and current steering block a for use with a ramp voltage generator, according to embodiments described herein. For added clarity, FIGS. 4 and 5 are described concurrently. The driver 400 of FIG. 4 can be an implementation of the driver 325 of FIG. 3. The sample and hold block and current steering block of FIG. 5 can be implementations of the sample and hold block 315 and the current steering block 320 of FIG. 3, respectively.

Referring to FIG. 5, a current source transistor ($M_P$) 515 injects current into a load 140, shown as ramp capacitor ($C_L$). The load 140 block is shown as part of the current steering block 320, but the load 140 can be implemented as a separate block in other embodiments. Accumulated charge on $C_L$ causes the voltage across $C_L$ to increase (e.g., linearly), which manifests as the ramp voltage ($V_R$) 145. If the drain of $M_P$ 515 were coupled directly with the ramp voltage 145 node, the changing ramp voltage 145 would also change the drain voltage of $M_P$ 515, which would impact the current being generated by $M_P$ 515 in an undesirable manner. To reduce variations in the ramp current as the ramp voltage 145 changes, a cascode transistor ($M_C$) 525 is used. $M_C$ 525 can maintain the drain terminal of $M_P$ 515 at a relatively constant voltage, thereby reducing variations in the ramp current. As illustrated, the $M_P$ 515 and $M_C$ 525 can be considered as components of a current generator block 550. For example, the current generator block 550 generates the ramp current at node 526 based on Vdd 305, the voltage at node 514, and the voltage at node 524 (and, incidentally, based on voltage seen at node 526, as described herein).

As described with reference to FIG. 3, instead of turning the ramp current ON and OFF, current steering block 320 steers the ramp current between $C_L$ (in a ramp run mode) and ground 307 (in a ramp stop mode). In some implementations, in the ramp-stop mode, the current is steered to any suitable ramp-stop path that is not the $C_L$ path, and the ramp-stop path may or may not be a ground path. The current steering block 320 can include two transistors, a ramp-path transistor ($M_R$) 530, and a ramp-stop-path transistor ($M_G$) 535. Each current path can be controlled according to a respective steering control signal 322, 324. For example, a first of these signals is a ramp-run signal 322, a second of these signals is a ramp stop signal 324, and the ramp run signal 322 and the ramp stop signal 324 are complementary. In the illustrated configuration, both $M_R$ 530 and $M_G$ 535 are PMOS transistors. As such, when the ramp run signal 322 is LOW and the ramp stop signal 324 is HIGH, $M_R$ 530 is ON and $M_G$ 535 is OFF, such that the ramp current is steered through the load path into $C_L$. When the ramp run signal 322 is HIGH and the ramp stop signal 324 is LOW, $M_R$ 530 is OFF and $M_G$ 535 is ON, such that the ramp current is steered through the ramp-stop path into ground 307 (or any another suitable path other than the load path).

To improve power supply rejection (PSR), the gate voltage of $M_P$ 515 and $M_C$ 525 are sampled and held by the sample and hold block 315. A first hold capacitor ($C_P$) 510 and a first hold switch ($SW_P$) 512 are used to sample a reference voltage 312 (e.g., from the reference generator 130, not shown) at a gate node 514 of $M_P$ 515. A second hold capacitor ($C_C$) 520 and a second hold switch ($SW_C$) 522 are used to sample a cascode voltage 505 at a gate node 524 of $M_C$ 525. $C_P$ 510 and $C_C$ 520 are each coupled between the supply voltage (Vdd) 305 and their respective gate nodes 514, 524. As such, once their respective switches 512, 522 are opened (i.e., $C_P$ 510 and $C_C$ 520 are decoupled from the reference voltage 312 and the cascode voltage 505, respectively), $C_P$ 510 and $C_C$ 520 maintain a substantially fixed potential difference between Vdd 305 and their respective gate nodes 514, 524, thereby ensuring that gate voltages at nodes 514 and 524 track Vdd 305. For example, if Vdd 305 increases by a millivolt, the gate voltages at nodes 514 and 524 will similarly increase by a millivolt. The source node of $M_P$ 515 is also coupled with the same Vdd 305. As such, when Vdd 305 changes, both the gate and source nodes of $M_P$ 515 will change by the same amount, and will cause the drain voltage at node 516 also to change by that amount to track Vdd 305.

If the voltage differences between the three terminals of $M_P$ 515 remain constant, the current supplied by $M_P$ 515 will remain constant even with fluctuations in Vdd 305. This would manifest as a perfect PSR. However, as described above, the same drain node 516 of $M_P$ 515 is also coupled with the source node of $M_C$ 525 to help maintain constant current with changes in the ramp voltage 145. Because $M_C$ 525 has a non-zero gate-drain capacitance ($C_{C\_GD}$), the gate voltage at gate node 524 of $M_C$ 525 will not perfectly track Vdd 305 (i.e., the Vdd 305 tracking of its source at node 516 will not be exactly the same as the Vdd 305 tracking at its gate node 524). As such, the output ramp current as seen by the load 140 (i.e., the current seen at the drain node 526 of $M_C$ 525) can still vary with Vdd 305 variations.

One approach is to minimize the size of the transistor $M_C$ 525. Smaller cascode transistors tend to have smaller $C_{C\_GD}$, such that minimizing the size of the cascode can minimize a primary source of Vdd 305 sensitivity. However, smaller transistors tend to have higher saturation voltages, such that a larger drain-source voltage headroom is needed for proper operation. Increasing the drain-source voltage headroom can involve either reducing the maximum achievable ramp voltage 145 (i.e., limiting the voltage range between the bottom and the top of the ramp), or degrading ramp linearity at larger voltages. For example, with a small cascode transistor, the resistance will tend to break down as the ramp voltage 145 increases, degrading the linearity of the transistor response. Such a non-linear response may not be tolerable in image sensor applications. Conventionally, a tradeoff can result: PSR specifications suggest minimizing the size of $M_C$ 525 to minimize the $C_{C\_GD}$; while linearity specifications suggest maximizing the size of $M_C$ 525, so that the resistance will not break down at larger ramp voltages.

Embodiments seek to improve PSR without sacrificing linearity by driving the current steering block 320 with supply-tracked signals, rather than directly using Vdd 305 and ground 307. In general, operation of the partial current generator 500 can be considered in three modes. In a first mode, the ramp current from node 526 is being steered to the ramp-stop path by the current steering block 320, the ramp voltage 145 is not being generated, and linearity and PSR can be considered as essentially irrelevant to operation. In a second mode, the ramp current from node 526 is being steered to the load 140 by the current steering block 320, and the ramp voltage 145 is being generated still at a relatively low voltage level. In the second mode, linearity and PSR are both highly relevant to performance of the ramp generation. PSR concerns relating to $M_C$ 525 can be addressed by $M_R$ 530, and the ramp voltage is low enough so that linearity can be maintained through $M_R$ 530. In a third mode, the ramp current from node 526 is still being steered to the load 140 by the current steering block 320, but the ramp voltage 145 has now increased to a relatively high voltage level. In the third mode, linearity is still highly relevant to performance of the ramp generation, but PSR is less of a concern (i.e., lower SNR can be tolerated at higher signal levels). At these higher voltage levels, $M_R$ 530 begins to break down, such that $M_R$ 530 can no longer be relied upon to address PSR concerns relating to $M_C$ 525, or for linearity; however, $M_C$ 525 can still maintain linearity for reliable ramp generation.

To maintain good PSR over these modes of operation, the current steering block 320 is designed to be driven by supply-tracked references and signals. For example, tracking steering control signals 322, 324 to Vdd 305 can help ensure that the drain node 526 of $M_C$ 525 similarly tracks to Vdd 305. As noted above, the source of $M_C$ 525 (at node 516) and the gate of $M_C$ 525 (at node 524) are already configured to track Vdd 305. By supply-tracking the current steering block 320 references, all three nodes of both $M_P$ 515 and $M_C$ 525 can be configured as supply-tracked nodes, thereby providing high PSR.

Turning to FIG. 4, the illustrated driver 400 generates the steering control signals 322, 324 to be supply-tracked to Vdd 305. As illustrated, the driver 400 receives the ramp start/stop signal 125 and outputs the ramp-run signal 322 and the ramp stop signal 324. The driver 400 includes two inverters 410 and 415, a delay block 420, and a ground referencing block 440. The driver 400 is coupled between the same Vdd 305 and ground 307 references used in FIG. 5. The inverters 410 and 415 each have positive terminals coupled to Vdd 305 and negative terminals coupled to a ground reference node ($V_{GH}$) 435 of the ground referencing block 440. The delay block 420 is configured to output a delayed and inverted version of the ramp start/stop signal 125 as delayed ramp stop/start signal 422.

Embodiments of the ground referencing block 440 are coupled between $V_{GH}$ 435 and ground 307 (i.e., a ground rail), and are configured to selectively operate in one of a ground-tracking mode or a supply-tracking mode based on the ramp start/stop signal 125 (or based on the delayed ramp stop/start signal 422). For example, the ground referencing block 440 operates in the supply-tracking mode when the ramp start/stop signal 125 is HIGH, and the ground referencing block 440 operates in the ground-tracking mode when the ramp start/stop signal 125 is LOW. In the ground-tracking mode, $V_{GH}$ 435 effectively tracks the ground rail and is not supply-tracked to Vdd 305 (i.e., the supply voltage rail); in the supply-tracking mode, $V_{GH}$ 435 is held to a supply-tracked ground level, such that $V_{GH}$ 435 stays a substantially fixed distance (difference in potential) away from Vdd 305. The ground referencing block 440 includes a ground referencing transistor ($M_{GH}$) 430 and a ground referencing capacitor ($C_G$) 425. $M_{GH}$ 430 is coupled between $V_{GH}$ 435 and ground 307, and its gate is coupled to the output of the delay block 420. $M_{GH}$ 430 is illustrated as an NMOS transistor, such that $M_{GH}$ 430 is ON when the output of the delay block 420 is HIGH (when the ramp start/stop signal 125 is LOW), and $M_{GH}$ 430 is OFF when the output of the delay block 420 is LOW (when the ramp start/stop signal 125 is HIGH).

When ramp start/stop signal 125 is LOW, the output of the delay block 420 is HIGH, $M_{GH}$ 430 is ON, and $V_{GH}$ 435 is coupled to ground 307. As such, when ramp start/stop signal 125 is LOW, the first inverter 410 has its output (which is also ramp-run signal 322) pulled HIGH to Vdd 305, and the second inverter 415 has its output (which is also ramp stop signal 324) pulled LOW to ground 307. In FIG. 5, it can be seen that a HIGH ramp-run signal 322 will turn OFF $M_R$ 530, and a LOW ramp stop signal 324 will turn ON $M_G$ 535, thereby steering the ramp current to the ramp-stop path (e.g., to ground 307).

When ramp start/stop signal 125 goes HIGH, the first inverter 410 has its output (which is also ramp-run signal 322) pulled LOW to $V_{GH}$ 435, and the second inverter 415 has its output (which is also ramp stop signal 324) pulled HIGH to Vdd 305. In FIG. 5, it can be seen that a LOW ramp-run signal 322 will turn ON $M_R$ 530, and a HIGH ramp stop signal 324 will turn OFF $M_G$ 535, thereby steering the ramp current into the load 140. After a small delay (generated by delay block 420), the output of delay block 420 (e.g., a delayed ramp stop/start signal 422) going LOW turns OFF $V_{GH}$ 435, and the ground 307 level is held as an absolute potential difference away from Vdd 305 across $C_G$ 425. In this configuration, rather than $V_{GH}$ 435 being at ground 307, $V_{GH}$ 435 is a supply-tracked ground reference; any variation in Vdd 305 will be reflected as the same variation in $V_{GH}$ 435. With the output of the first inverter 410 pulled LOW to $V_{GH}$ 435 (rather than to ground 307), the ramp-run signal 322 is a supply-tracked signal.

As noted above, the delay block 420 causes there to be a delay between the moment when ramp start/stop signal 125 goes HIGH and the moment when the output of delay block 420 goes LOW. During that delay (i.e., immediately after ramp start/stop signal 125 goes HIGH), $V_{GH}$ 435 remains pegged to ground 307 through $M_{GH}$ 430. The ramp-run signal 322 only becomes a supply-tracked signal after the delay. The amount of delay can be configured to allow parasitic capacitances of the inverters 410 and 415 (i.e., at least parasitic capacitances of the ramp-run signal 322 node) to discharge to ground 307. For example, when ramp start/stop signal 125 goes HIGH, the output node of the first inverter 410 (i.e., the node of ramp-run signal 322) is pulled LOW, and the output node can have certain charge stored in parasitic capacitance from immediately prior, when the same node had been pulled HIGH. By leaving $V_{GH}$ 435 pegged to ground 307 through $M_{GH}$ 430 for a short time after the ramp-run signal 322 node transitions from HIGH to LOW, the parasitic capacitance can discharge, and the ramp-run signal 322 node can be pulled completely to ground 307 prior to converting $V_{GH}$ 435 to a supply-tracked reference node.

As noted above, configuring the ramp-run signal 322 to be supply-tracked to Vdd 305, and also permitting the drain of $M_C$ 525 (at node 526) to be supply-tracked to Vdd 305, the ramp current can be very robust to fluctuations in Vdd 305. As such ramp voltage 145 can be generated with high PSR. It has been experimentally shown that such implementations can provide more than a 10-× (e.g., 20-dB) reduction in output current variations. Some remaining PSR degradation can result from parasitic capacitance at the $V_{GH}$ 435 node, which can include the drain-source and drain-gate capacitances of $M_{GH}$ 430. However, these parasitic capacitances tend to have little effect on performance, as $M_{GH}$ 430 is OFF during ramp generation. Another source of parasitic capacitance can be the drain-gate capacitance of $M_R$ 530. However, as noted above, some implementations only rely on $M_R$ 530 to perform well at relatively low ramp voltage 145 levels, so that $M_R$ 530 can be implemented using a smallest practical device. In effect, a relatively large $M_C$ 525 tends to provide a relatively small saturation voltage for good linearity across a larger ramp voltage, but the larger $M_C$ 525 tends to have poor PSR performance. The relatively small $M_{GH}$ 430 provides good PSR performance at relatively low ramp voltage 145 levels (where high SNR is more critical), even though the small $M_{GH}$ 430 will tend to have relatively large saturation voltage and a tendency to crash as the ramp voltage 145 increases.

Figure 6:
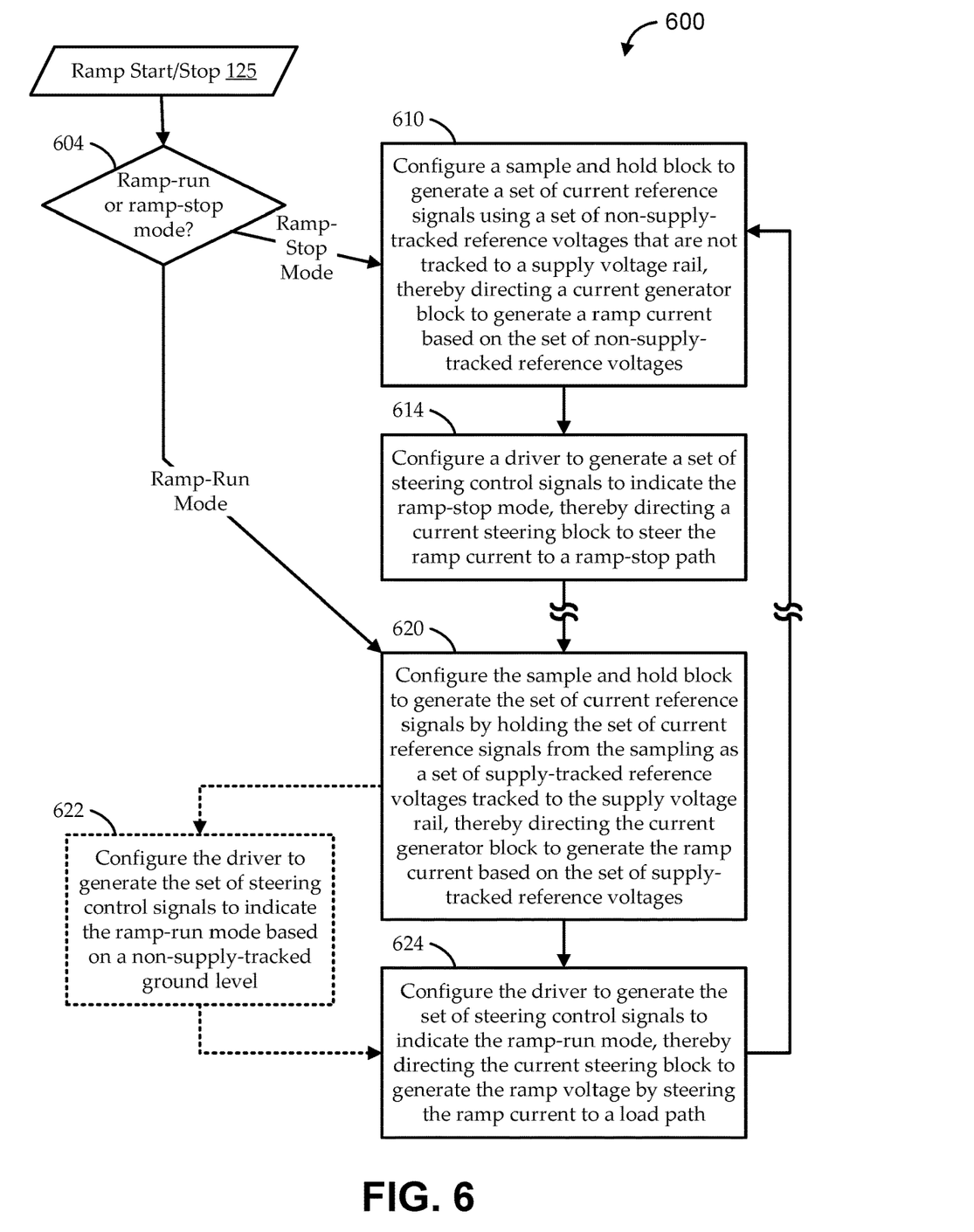
FIG. 6 shows a flow diagram of an illustrative method 600 for generating a ramp voltage, according to various embodiments.

FIG. 6 shows a flow diagram of an illustrative method 600 for generating a ramp voltage, according to various embodiments. Embodiments of the method 600 can be performed using the ramp voltage generators and/or components thereof, such as described with reference to FIGS. 3-5. Embodiments begin at stage 604 by detecting a state of a ramp start/stop signal 125. The ramp start/stop signal 125 can indicate operation in either a ramp-stop mode or a ramp-run mode. For example, during a pixel conversion process for a pixel of a CMOS image sensor, the ramp start/stop signal 125 may begin by indicating operation in the ramp-stop mode in a first timeframe, switch to the ramp-run mode for a second timeframe for the pixel conversion (i.e., to generate a ramp voltage for use in the pixel conversion), and switch back to the ramp-stop mode after the pixel conversion. As another example, during a two-phase pixel conversion process, the ramp start/stop signal 125 may begin in the ramp-stop mode in a first timeframe, switch to the ramp-run mode for a second timeframe for a first phase of the pixel conversion (i.e., to generate a ramp voltage for use in the pixel conversion), switch back to the ramp-stop mode between phases in a third timeframe, switch back to the ramp-run mode for a fourth timeframe for the second phase of the pixel conversion (i.e., to generate another ramp voltage for use in the second pixel conversion phase), and switch back to the ramp-stop mode after the second phase of the pixel conversion is complete.

In response to detecting at stage 604 that the ramp start/stop signal 125 indicates the ramp-stop mode, embodiments can perform stages 610 and 614. At stage 610, embodiments can configure a sample and hold block to generate a set of current reference signals using a set of non-supply-tracked reference voltages that are not tracked to a supply voltage rail, thereby directing a current generator block to generate a ramp current based on the set of non-supply-tracked reference voltages. At stage 614, embodiments can configure a driver to generate a set of steering control signals to indicate the ramp-stop mode, thereby directing a current steering block to steer the ramp current to a ramp-stop path.

In response to detecting at stage 604 that the ramp start/stop signal 125 indicates the ramp-run mode, embodiments can perform stages 620 and 624. At stage 620, embodiments can configure the sample and hold block to generate the set of current reference signals by holding the set of current reference signals from the sampling as a set of supply-tracked reference voltages tracked to the supply voltage rail, thereby directing the current generator block to generate the ramp current based on the set of supply-tracked reference voltages. At stage 624, embodiments can configure the driver to generate the set of steering control signals to indicate the ramp-run mode, thereby directing the current steering block to generate the ramp voltage by steering the ramp current to a load path. Stages 620 and 624 can be performed, such that, in the ramp-run mode, the ramp current is supply-tracked to the supply voltage rail based on the set of steering control signals and the set of current reference signals.

In some embodiments, configuring the driver in stage 614 includes configuring a ground referencing block of the driver to operate in a ground-tracking mode to sample a ground rail as a ground level on a ground reference node. In such embodiments, configuring the driver at stage 624 includes configuring the ground referencing block of the driver to operate in a source-tracking mode to hold the ground level at the ground reference node as supply-tracked to the supply voltage rail. In such embodiments, each of the set of steering control signals is selectively generated based on one of the supply voltage rail or the ground reference node (i.e., a HIGH signal level corresponds to the voltage level of the supply voltage rail, and a LOW signal level corresponds to the voltage level at the ground reference node). In some such embodiments, configuring the driver in stage 614 to generate the set of steering control signals to indicate the ramp-stop mode includes driving a first inverter to output a first of the set of steering control signals to correspond to the supply voltage rail, and driving a second inverter to output a second of the set of steering control signals to correspond to ground rail at the ground reference node; and configuring the driver in stage 624 to generate the set of steering control signals to indicate the ramp-run mode includes driving the first inverter to output the first of the set of steering control signals to correspond to the supply-tracked ground level at the ground reference node, and driving the second inverter to output the second of the set of steering control signals to correspond to the supply voltage rail.

In some embodiments, the ramp start/stop signal 125 is detected at stage 604 as indicating the ramp-stop mode in a first timeframe in a manner that triggers stages 610 and 614, and the ramp start/stop signal 125 is detected at stage 604 as indicating the ramp-run mode in a second timeframe in a manner that triggers stages 620 and 624. In some such embodiments, switching from the ramp-stop mode (i.e., including stages 610 and 614) to the ramp-run mode (i.e., including stages 620 and 624) involves an intermediate stage, such that the second timeframe follows the first timeframe after a delay corresponding to a third timeframe (i.e., the third timeframe is a small delay time between the first and second timeframes). In the third timeframe, the ramp start/stop signal 125 changes state to indicate the ramp-run mode, but the set of steering control signals is referenced to a ground rail, rather than to a supply-tracked ground reference. As indicated by stage 622, responsive to the ramp start/stop signal 125 indicating the ramp-run mode in the third timeframe, configuring the driver includes generating the set of steering control signals to indicate the ramp-run mode, while continuing to configure the ground referencing block of the driver to operate in the ground-tracking mode to sample the ground rail as the ground level on the ground reference node, such that at least one of the set of steering control signals is generated to correspond to the ground rail (non-supply-tracked) at the ground reference node. After the delay (i.e., in the second timeframe, after the third timeframe), the ramp start/stop signal 125 continues to indicate the ramp-run mode, but the set of steering control signals is referenced to the supply-tracked ground reference.

In some embodiments, the set of current reference signals includes: a first current reference signal generated to drive a gate of a current source transistor having a first source terminal coupled with the supply voltage rail, and having a first drain terminal; and a second current reference signal generated to drive a gate of a cascode transistor having a second source terminal coupled with the first drain terminal, and a second drain terminal to output the ramp current. In some such embodiments, responsive to the ramp start/stop signal indicating the ramp-stop mode in the first timeframe, configuring the sample and hold block at stage 610 includes closing a first hold switch to sample an output of a first voltage reference source onto a first gate node as a first of the set of non-supply-tracked reference voltages, and closing a second hold switch to sample an output of second first voltage reference source onto a second gate node as a second of the set of non-supply-tracked reference voltages. In some such embodiments, responsive to the ramp start/stop signal indicating the ramp-run mode in the second timeframe, configuring the sample and hold block in stage 620 includes opening the first hold switch to decouple the output of the first voltage reference source from the first gate node and holding the first gate node at a first potential difference relative to the supply voltage rail across a first hold capacitor as a first of the set of supply-tracked reference voltages, and opening the second hold switch to decouple the output of the second voltage reference source from the second gate node and holding the second gate node at a second potential difference relative to the supply voltage rail across a second hold capacitor as a second of the set of supply-tracked reference voltage. In such embodiments, the first gate node corresponds to the first current reference signal, and the second gate node corresponds to the second current reference signal.

The method 600 shows stages 610 and 620 occurring at part of a ramp-stop mode or a ramp-run mode operation, respectively. In some embodiments, the sample and hold in stage 610 occurs in each cycle of the ramp-stop mode, and the sample and hold in stage 620 occurs in each cycle of the ramp-run mode operation. In other embodiments, the sample and hold in stages 610 and/or 620 occurs in fewer than all cycles of the ramp-stop and/or ramp-run mode, such as in each of multiple cycles of the ramp-stop and/or ramp-run mode. As such, the same current reference signals generated in stage 610 and/or 620 can be used to support multiple iterations of stages 614 and/or 624, respectively. For example, the same current reference signals can be used for every set of N (e.g., fifty) ramp generation cycles, for all cycles occurring during some predetermined time window, for all cycles until some predetermined trigger condition is detected, etc.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A ramp voltage generator, comprising:
    a sample and hold block to generate a set of current reference signals by, in a sample mode, sampling the set of current reference signals from a set of reference voltages, and, in a hold mode, holding the set of current reference signals from the sampling as a set of supply-tracked reference voltages tracked to a supply voltage rail;
    a current generator block to generate a ramp current based on the supply voltage rail and the set of current reference signals;
    a driver to generate a set of steering control signals to selectively indicate one of a ramp-run mode and a ramp-stop mode responsive to a ramp start/stop signal, such that the set of steering control signals are supply-tracked to the supply voltage rail at least when indicating the ramp-run mode; and
    a current steering block, coupled with the current generator block and the driver, to steer the ramp current to a load path to generate a ramp voltage responsive to the set of steering control signals indicating the ramp-run mode, and to steer the reference current to a ramp-stop path responsive to the set of steering control signals indicating the ramp-stop mode, the ramp-stop path being a separate current path from the load path,
    such that, in the ramp-run mode, the ramp current is supply-tracked to the supply voltage rail based on the set of steering control signals and the set of current reference signals.

2. The ramp voltage generator of claim 1, wherein the driver comprises:
    a ground referencing block coupled between a ground reference node and a ground rail, and configured to selectively operate in one of a ground-tracking mode or a supply-tracking mode based on the ramp start/stop signal, such that the ground rail is sampled as a ground level on the ground reference node in the ground-tracking mode, and the ground level is held supply-tracked to the supply voltage rail in the supply-tracking mode,
    wherein, when the ramp start/stop signal indicates to operate in the ramp-run mode, and the ground referencing block is operating in the supply-tracking mode, at least one of the set of steering control signals indicating the ramp-run mode is generated to be supply-tracked to the supply voltage rail.

3. The ramp voltage generator of claim 2, wherein the ground referencing block comprises:
    a ground referencing capacitor coupled between the ground reference node and the supply voltage rail; and
    a ground referencing transistor coupled between the ground reference node and the ground rail, and configured so that:
        the ground referencing transistor is ON in the ground-tracking mode to couple the ground reference node to the ground rail through the ground referencing transistor; and
        the ground referencing transistor is OFF in the supply-tracking mode to hold the ground level as a potential difference relative to the supply voltage rail across the ground referencing capacitor.

4. The ramp voltage generator of claim 2, wherein the driver further comprises:
    first and second inverters, each having a respective positive terminal coupled to the supply voltage rail, and a respective negative terminal coupled to the ground reference node,
    wherein the first inverter is to generate a first steering control signal of the set of steering control signals responsive to the ramp start/stop signal, and the second inverter is to generate a second steering control signal of the set of steering control signals as a complement to the first steering control signal.

5. The ramp voltage generator of claim 2, wherein the driver further comprises:
a delay block coupled with the ground referencing block to generate a delayed ramp stop/start signal by delaying and inverting the ramp start/stop signal, wherein the ground referencing block is configured to selectively operate in one of the ground-tracking mode or the supply-tracking mode based on the delayed ramp stop/start signal, such that:
responsive to the ramp start/stop signal being de-asserted and the delayed ramp stop/start signal being asserted, the ground referencing block operates in the ground-tracking mode, and the set of steering control signals indicates the ramp-stop mode;
responsive to the ramp start/stop signal being asserted and the delayed ramp stop/start signal being asserted, the ground referencing block operates in the ground-tracking mode, and the set of steering control signals indicates the ramp-run mode with the set of steering control signals not supply-tracked to the supply voltage rail; and
responsive to the ramp start/stop signal being asserted and the delayed ramp stop/start signal being de-asserted, the ground referencing block operates in the supply-tracking mode, and the set of steering control signals indicates the ramp-run mode with the set of steering control signals supply-tracked to the supply voltage rail.

6. The ramp voltage generator of claim 1, wherein:
the set of current reference signals comprises a first current reference signal generated based on sampling a first reference voltage, and a second current reference signal generated based on sampling a second reference voltage; and
the current generator block comprises:
a current source transistor having a first gate terminal coupled with the first current reference signal, a first source terminal coupled with the supply voltage rail, and a first drain terminal; and
a cascode transistor having a second gate terminal coupled with the second current reference signal, a second source terminal coupled with the first drain terminal, and a second drain terminal coupled with the current steering block.

7. The ramp voltage generator of claim 6, wherein the sample and hold block comprises:
a first hold capacitor coupled between the supply voltage rail and a first gate node, and a first hold switch coupled between a first voltage reference source and the first gate node, wherein an output of the first voltage reference source is sampled as the first reference voltage on the first gate node when the first hold switch is closed, and the first gate node is decoupled from the first voltage reference source and held at a substantially fixed potential difference away from the supply voltage rail across the first hold capacitor based on the sampling of the first reference voltage; and
a second hold capacitor coupled between the supply voltage rail and a second gate node, and a second hold switch coupled between a second voltage reference source and the second gate node, wherein an output of the second voltage reference source is sampled as the second reference voltage on the second gate node when the second hold switch is closed, and the second gate node is decoupled from the second voltage reference source and held at a substantially fixed potential difference away from the supply voltage rail across the second hold capacitor based on the sampling of the second reference voltage,
wherein the first current reference signal is generated as a voltage level at the first gate node, and the second current reference signal is generated as a voltage level at the second gate node.

8. The ramp voltage generator of claim 1, wherein:
the current generator block comprises a cascode transistor sized to have a low saturation voltage; and
the load path of the current steering block comprises a switching transistor sized to have a low gate-drain capacitance.

9. The ramp voltage generator of claim 1, further comprising:
a reference generator to generate at least one of the reference voltages based on a bandgap voltage generator coupled with a current mirror.

10. The ramp voltage generator of claim 1, further comprising:
a ramp controller coupled with the driver and the sample and hold block, and configured to generate a set of ramp control signals comprising at least the ramp start/stop signal to direct the driver selectively to operate in one of the ramp-run mode or the ramp-stop mode, and a sample/hold signal to direct the sample and hold block selectively to operate in one of the sample mode or the hold mode.

11. An analog-to-digital converter comprising:
the ramp voltage generator of claim 1; and
a plurality of pixel conversion comparators, each coupled with the load path of the current steering block to generate a respective pixel output based on comparing the ramp voltage against a respective one of a plurality of pixel response input voltages.

12. A method for generating a ramp voltage, the method comprising:
responsive to a ramp start/stop signal indicating a ramp-stop mode in a first timeframe:
configuring a sample and hold block to generate a set of current reference signals using a set of non-supply-tracked reference voltages that are not tracked to a supply voltage rail, thereby directing a current generator block to generate a ramp current based on the set of non-supply-tracked reference voltages; and
configuring a driver to generate a set of steering control signals to indicate the ramp-stop mode, thereby directing a current steering block to steer the ramp current to a ramp-stop path that is a separate current path from the load path; and
responsive to the ramp start/stop signal indicating a ramp-run mode in a second timeframe:
configuring the sample and hold block to generate the set of current reference signals by holding the set of current reference signals from the sampling as a set of supply-tracked reference voltages tracked to the supply voltage rail, thereby directing the current generator block to generate the ramp current based on the set of supply-tracked reference voltages; and
configuring the driver to generate the set of steering control signals to indicate the ramp-run mode, thereby directing the current steering block to generate the ramp voltage by steering the ramp current to a load path, such that, in the ramp-run mode, the ramp current is supply-tracked to the supply voltage rail based on the set of steering control signals and the set of current reference signals.

13. The method of claim 12, wherein:
responsive to the ramp start/stop signal indicating the ramp-stop mode in the first timeframe, configuring the driver comprises configuring a ground referencing block of the driver to operate in a ground-tracking mode to sample a ground rail as a ground level on a ground reference node;
responsive to the ramp start/stop signal indicating the ramp-run mode in the second timeframe, configuring the driver comprises configuring the ground referencing block of the driver to operate in a source-tracking mode to hold the ground level at the ground reference node as supply-tracked to the supply voltage rail; and
each of the set of steering control signals is selectively generated based on one of the supply voltage rail or the ground reference node.

14. The method of claim 13, wherein:
responsive to the ramp start/stop signal indicating the ramp-stop mode in the first timeframe, configuring the driver to generate the set of steering control signals to indicate the ramp-stop mode comprises driving a first inverter to output a first of the set of steering control signals to correspond to the supply voltage rail, and driving a second inverter to output a second of the set of steering control signals to correspond to ground rail at the ground reference node; and
responsive to the ramp start/stop signal indicating the ramp-run mode in the second timeframe, configuring the driver to generate the set of steering control signals to indicate the ramp-run mode comprises driving the first inverter to output the first of the set of steering control signals to correspond to the supply-tracked ground level at the ground reference node, and driving the second inverter to output the second of the set of steering control signals to correspond to the supply voltage rail.

15. The method of claim 13, wherein the second timeframe follows the first timeframe after a delay corresponding to a third timeframe in which the ramp start/stop signal indicates the ramp-run mode, and further comprising:
responsive to the ramp start/stop signal indicating the ramp-run mode in the third timeframe, configuring the driver comprises generating the set of steering control signals to indicate the ramp-run mode, while continuing to configure the ground referencing block of the driver to operate in the ground-tracking mode to sample the ground rail as the ground level on the ground reference node, such that at least one of the set of steering control signals is generated to correspond to the ground rail at the ground reference node.

16. The method of claim 12, wherein the set of current reference signals comprises:
a first current reference signal generated to drive a gate of a current source transistor having a first source terminal coupled with the supply voltage rail, and having a first drain terminal; and
a second current reference signal generated to drive a gate of a cascode transistor having a second source terminal coupled with the first drain terminal, and a second drain terminal to output the ramp current.

17. The method of claim 16, wherein:
responsive to the ramp start/stop signal indicating the ramp-stop mode in the first timeframe, configuring the sample and hold block comprises closing a first hold switch to sample an output of a first voltage reference source onto a first gate node as a first of the set of non-supply-tracked reference voltages, and closing a second hold switch to sample an output of second first voltage reference source onto a second gate node as a second of the set of non-supply-tracked reference voltages; and
responsive to the ramp start/stop signal indicating the ramp-run mode in the second timeframe, configuring the sample and hold block comprises opening the first hold switch to decouple the output of the first voltage reference source from the first gate node and holding the first gate node at a first potential difference relative to the supply voltage rail across a first hold capacitor as a first of the set of supply-tracked reference voltages, and opening the second hold switch to decouple the output of the second voltage reference source from the second gate node and holding the second gate node at a second potential difference relative to the supply voltage rail across a second hold capacitor as a second of the set of supply-tracked reference voltage,
wherein the first gate node corresponds to the first current reference signal, and the second gate node corresponds to the second current reference signal.

* * * * *